United States Patent [19]

Ankri et al.

[11] Patent Number: 4,728,616
[45] Date of Patent: Mar. 1, 1988

[54] BALLISTIC HETEROJUNCTION BIPOLAR TRANSISTOR

[75] Inventors: David G. Ankri, Paris, France; Lester F. Eastman; Walter H. Ku, both of Ithaca, N.Y.

[73] Assignee: Cornell Research Foundation, Inc., Ithaca, N.Y.

[21] Appl. No.: 16,893

[22] Filed: Feb. 20, 1987

Related U.S. Application Data

[60] Division of Ser. No. 771,169, Sep. 3, 1985, Pat. No. 4,672,404, which is a continuation of Ser. No. 419,293, Sep. 17, 1982, abandoned.

[51] Int. Cl.$^4$ .............. H01L 21/22; H01L 21/26; H01L 29/205
[52] U.S. Cl. ..................... 437/22; 437/24; 437/31; 437/133; 148/DIG. 72; 148/DIG. 84
[58] Field of Search .................... 357/4, 16, 34; 148/DIG. 72, DIG. 169, DIG. 84; 437/22, 24, 31, 133

[56] References Cited

U.S. PATENT DOCUMENTS

| | | |
|---|---|---|
| 3,209,215 | 9/1965 | Esaki . |
| 3,211,970 | 10/1965 | Christian . |
| 3,488,512 | 1/1970 | Lehrer et al. . |
| 4,119,994 | 10/1978 | Jain et al. . |
| 4,173,763 | 11/1979 | Chang et al. . |
| 4,286,275 | 8/1981 | Heiblum . |
| 4,366,493 | 12/1982 | Braslau et al. . |
| 4,395,722 | 7/1983 | Esaki et al. . |
| 4,482,910 | 11/1984 | Nishizawa et al. . |

OTHER PUBLICATIONS

Lester F. Eastman, "Ballistic Electrons in Compound Semiconductors", IEEE Spectrum (Feb. 1986), pp. 42–45.
W. P. Dumke et al, "Heterostructure Long Lifetime Hot Electron Transistor", IBM Technical Disclosure Bulletin, vol. 24 (1981) pp. 3229–3231.
H. J. Hovel, "Graded Bandgap Heterojunction Bipolar Transistor", IBM Technical Disclosure Bulletin, vol. 22 (1980), p. 3875.
Herbert Kroemer, "Heterostructure Bipolar Transistors and Integrated Circuits", Proceedings of the IEEE, vol. 70, No. 1, Jan. 1982.

*Primary Examiner*—Olik Chaudhuri
*Attorney, Agent, or Firm*—Jones, Tullar & Cooper

[57] ABSTRACT

A heterojunction transistor doped to form a specially-shaped emitter-base conduction band step or spike is disclosed. The potential barrier is then utilized to accelerate electrons across the base region at the maximum velocity obtainable without scattering electrons to the upper valleys. In this manner the electrons may be transported across the base region virtually without collisions and at a velocity approximately 10 times that of normal electron diffusion across the base region, thus increasing the frequence response of the transistor.

5 Claims, 14 Drawing Figures

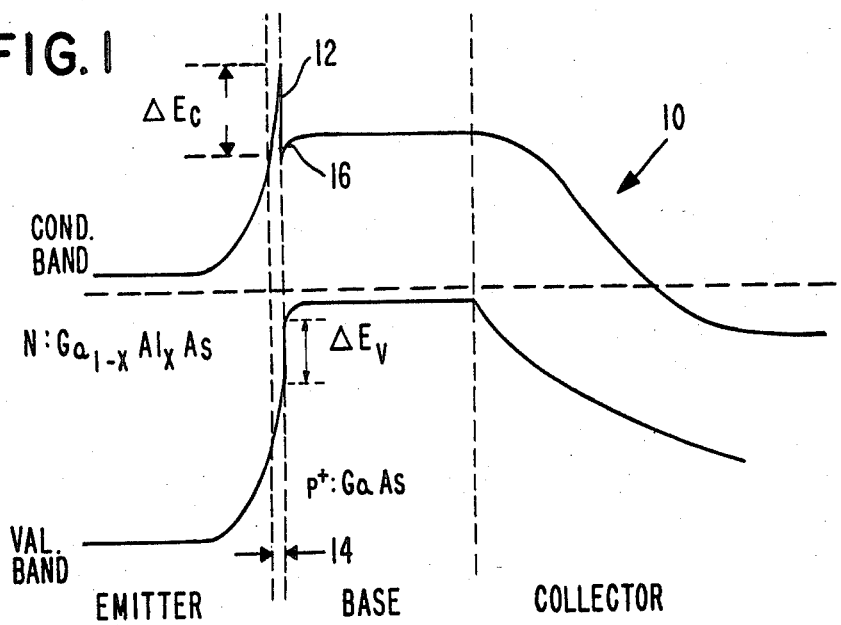
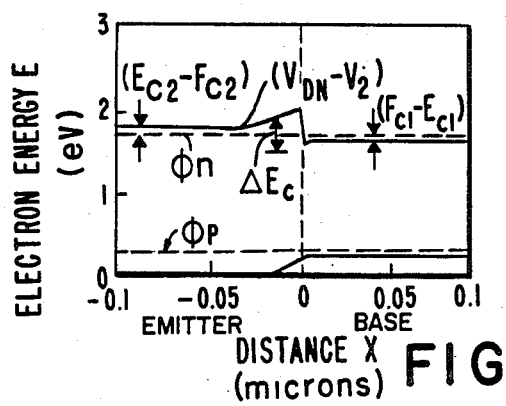
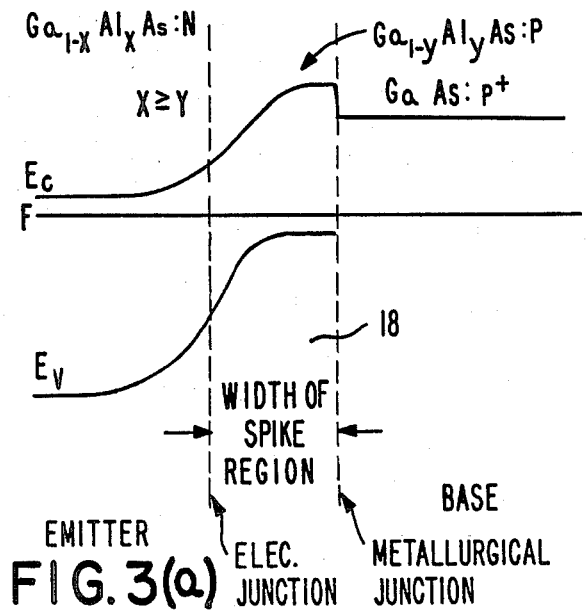
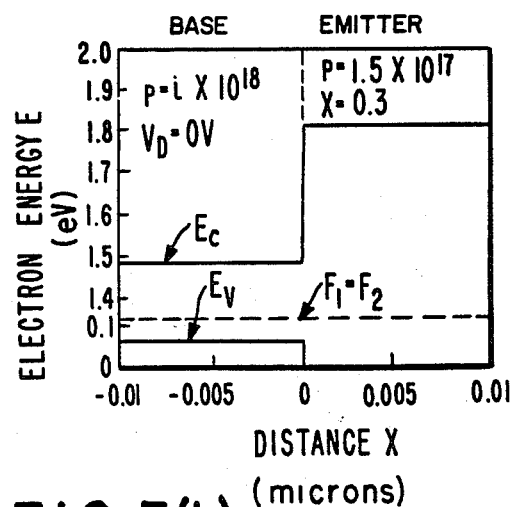
FIG. 1
FIG. 2
FIG. 3(a)
FIG. 3(b)

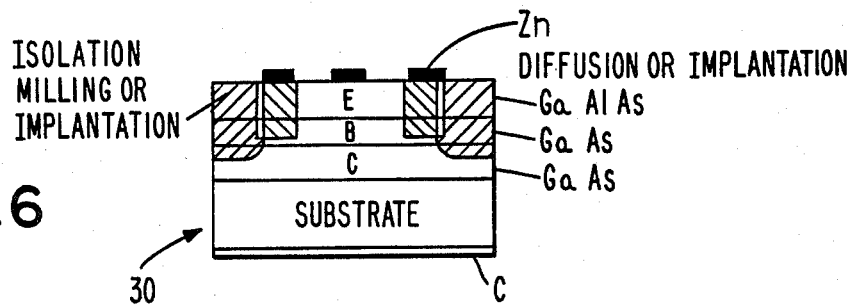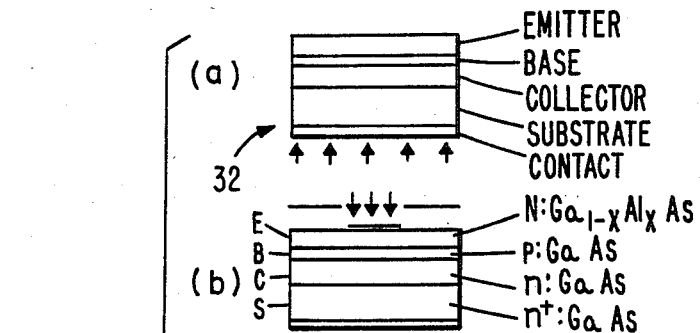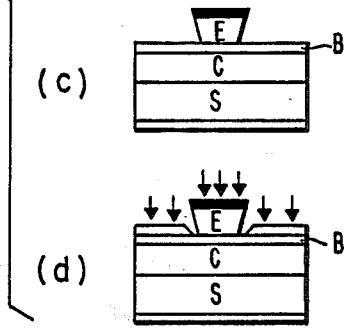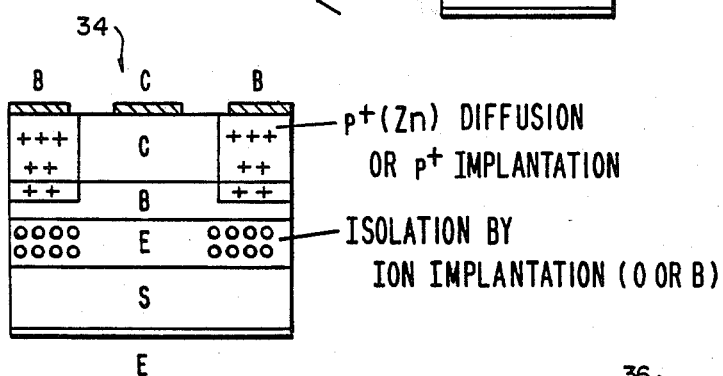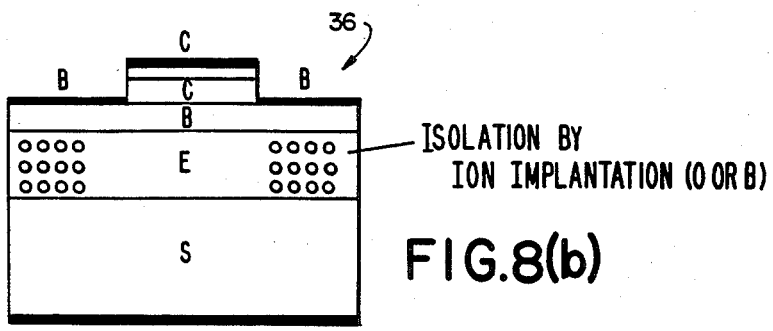

BALLISTIC HETEROJUNCTION BIPOLAR TRANSISTOR

This invention arose out of research sponsored by the Office of Naval Research, Grant No. N00014-75-C-0739 and by the U.S. Department of the Air Force, Grant No. F49620-81-C-0082.

This application is a division of Ser. No. 771,169, filed Sept. 3, 1985, now U.S. Pat. No. 4,672,404 which is a continuation of Ser. No. 419,293, filed Sept. 17, 1982 now abandoned.

BACKGROUND OF THE INVENTION

The present invention relates, in general, to three-terminal, semiconductor solid state devices such as bipolar transistors, permeable base transistors, and planar doped barrier transistors, and more particularly to such a device wherein the emitter-base barrier is so constructed as to permit near ballistic electron motion, and to thereby provide a device capable of very high speed operation.

In a semiconductor device having a "vertical" structure, e.g., where current flows from the emitter through the base to the collector, and where the current flow is modulated by the base current or the base voltage, limitations are encountered in the higher frequency ranges because of the diffusion mechanism by which the charge carriers move through the device. It is known that diffusion limitations can be reduced by decreasing the thickness of the base region, but such a decrease also undesirably increases base resistance. In addition, such a decrease in thickness does not entirely eliminate diffusion mechanism limitations because in the usual bipolar heterojunction device, electrons are injected into the base region with a low (about 26 meV) thermal energy; thus, high frequency operation of such devices, particularly in the microwave frequency range, has not been entirely successful.

U.S. Pat. No. 3209215 to Esaki is an early patent disclosing heterojunction semiconductor devices, wherein a narrow base region is provided, but where the emitter, base and collector are of the same conductivity type. This patent discloses a structure wherein tunneling effects are produced, however, and no consideration of the utilization of a heterojunction triode with a base of opposite conductivity is disclosed.

U.S. Pat. No. 4286275 to Heiblum also relates to a three—terminal semiconductor device and is directed to a construction for obtaining increased switching speed. The patent recognizes the limitations of diffusion motion of the charge carriers, and solves the problem by selecting the barrier height and width for the emitter (or carrier injecting region) so that the dominant current injection mechanism is that of tunneling.

U.S. Pat. No. 4173763 to Chang et al also relates to a heterojunction transistor in which a base thickness of 100 Å or less is used to produce tunneling from the emitter to the collector, in order to provide a high speed device.

Although these prior art patents illustrate that the limitations of the diffusion mechanism are known, and that attempts have been made to overcome them through various structures in order to produce transistors which operate at higher frequencies, the prior art does not suggest that ballistic or near ballistic transport of carriers could be used to improve the speed of operation.

Although ballistic motion in a thin base of GaAs bipolar transistor has been suggested by Rohr et al, "Solid State Electronics," 1974, Vol. 17, pp. 729–734, they did not take into account the fact that high energy motion can lead to scattering effects, wherein electrons are scattered to upper valleys, did not recognize that potential barriers could be used to launch electrons, and thus overlooked the fact that such motion could be utilized to solve the problem of diffusion limitations to obtain high speed operation.

SUMMARY OF THE INVENTION

It is, therefore, an object of the present invention to provide a high speed, three terminal, heterojunction, bipolar semiconductor device which overcomes the limitations of the diffusion mechanism.

It is another object of the invention to provide a ballistic heterojunction bipolar transistor having a base region formed with an opposite type conductivity than the emitter and collector regions, and wherein the thickness of the base region is of the order of the length of the mean free path of the minority carriers, the carriers being injected from the emitter to the base region by way of a barrier produced by the band discontinuity of the emitter-base heterojunction.

It is another object of the invention to provide a high speed heterojunction bipolar transistor wherein limitations due to the diffusion mechanism are overcome by providing an emitter-base interface barrier which serves to accelerate electrons to energies close to but lower than the energy of scattering to upper energy valleys.

It is another object of the invention to provide a ballistic heterojunction bipolar transistor having an emitter-base barrier which permits near ballistic electron motion without scattering.

Briefly, the present invention is directed to a heterojunction bipolar semiconductor device having emitter, base and collector regions wherein the emitter-base junction may be a GaAlAs—GaAs junction, or may be formed from other III–V compounds. The device is so formed that the difference of electron affinity between the emitter and base materials creates a potential step or "spike" barrier in the conduction band edge. This spike produces a potential drop for electrons crossing the barrier, and is used for accelerating the electrons to energy levels close to, but lower than, the level which results in scattering to the upper valleys (mainly by polaroptical phonon interaction). The energy for scattering in GaAs is $\leq \Delta E_{\Gamma-L}=0.31$ eV where $E_\Gamma$ is the energy level for the central valley, and $E_\Gamma$ is the energy level for the upper valley. For GaInAs, $\Delta E_{T-L}=0.56$ eV. By utilizing an energy level below the scattering level, a near ballistic electron motion is produced so that the electrons can pass through a thin base region nearly without collisions, this motion occurring inside the bulk of the base region, rather than at the surface where antagonistic effects can occur. This allows the vertical structure to take full advantage of the upper limits of high velocity for the electron, and provides emitter-to-collector transit time in the subpicosecond range.

The emitter-base conduction band step, or spike, is chosen so that its height allows thermionic emission of electrons over the step thereafter, the electrons are accelerated to have a kinetic energy in the range of ten (10) times the thermal energy. This kinetic energy is preferably about 10% less than the energy needed to transfer electrons to the upper valley, and thus provides a maximum electron velocity and a maximum mean free path length (close to 0.15 μm for 0.3 eV). At this energy level, electrons travel by drift, rather than by the diffusion mechanism, and this reduces the collision effect of impurities in the material. If collisions do occur for some of the injected electrons, the effect is small, and the energy is only reduced by a little more than 10%. Also, the deflection angle range can be small (5° to 10°), so that the desired direction of the electron velocity is not seriously changed.

The width and, more generally, the shape of the spike (interfacial) region is designed to prevent tunneling through the complete barrier so that the majority of electrons can be accelerated at the appropriate energy (and not at a lower energy). The shape is also controlled to reduce quantum reflection of electrons as they are injected; thus, the slope of the barrier must be smaller on the emitter side than on the base side.

For a GaAs semiconductor, the thermal injection energy is about 0.26 eV. If the interfacial region between the emitter and the base is, for example, 100 Å thick, then the field is $$\frac{0.26 \text{ eV}}{100 \text{Å}} = 2.6 \times 10^5 \text{ V/cm},$$

which will produce the desired electron velocity. Although other III–V semiconductor compounds produce different thermal injection energies, and different interfacial thicknesses will produce different results, the principle is the same.

Other controlling factors, in addition to the shape of the interfacial region, for obtaining a desired electron velocity are the width of the base region and the concentrations of the impurities in the semiconductor. Thus, by varying these factors it is possible to obtain an abrupt field gradient in the interfacial areas (i.e., in the area between a homogenous GaAs region and a homogenous GaAlAs region in the semiconductor), or to obtain a gradual gradient, and these variations allow fabrication of spikes of different shapes and heights. In an abrupt gradient, the interfacial region may be 15 Å wide, while in the gradual case, the interface may be between 15 Å and 100 Å wide.

Transistors incorporating these features can be constructed by diffusion or implantation techniques in a quasi-planar structure, through mesa structures, or the like.

BRIEF DESCRIPTION OF THE DRAWINGS

The foregoing and additional objects, features and advantages of the present invention will become apparent to those of skill in the art from a consideration of the following detailed description of preferred embodiments, taken in conjunction with the accompanying drawings, in which:

FIG. 1 is an energy band diagram of a three-terminal semiconductor device having an abrupt heterojunction in accordance with a preferred form of the present invention;

FIG. 2 is an energy band diagram of the device of FIG. 1, having a forward bias;

FIG. 3(a) is an energy band diagram of a second embodiment of the semiconductor heterojunction of the present invention;

FIG. 3(b) is an energy band diagram for a third embodiment of the semiconductor heterojunction of the present invention;

FIG. 6 is a schematic drawing of a quasi-planar transistor structure in accordance with the present invention;

FIGS. 7(a)–7(d) are schematic drawings of the fabrication of a mesa transistor structure; and FIGS. 8(a) and 8(b) are schematic drawings of additional forms of transistor structures in accordance with the invention.

DESCRIPTION OF PREFERRED EMBODIMENTS

Figure 4A:
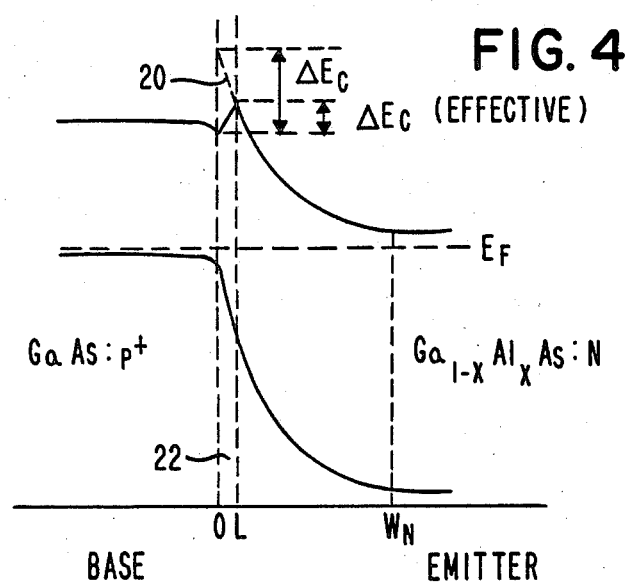
FIGS. 4(a) and 4(b) are energy band diagrams of fourth and fifth embodiments of the semiconductor heterojunction of the present invention.

Turning now to a more detailed consideration of the drawings, FIG. 1 illustrates at 10 the energy band of a three terminal, semiconductor solid state device such as a bipolar transistor having an emitter region E, a base region B, and a collector region C. The energy band illustrates at 12 the spike, or barrier, which is formed at the interface 14, or heterojunction, between the emitter and the base. The emitter is an N type GaAlAs semiconductor material. In this device, there is zero bias, and $\Delta E_c \approx 0.85 E_g$, and $\Delta E_v = 0.15 E_g$, where $E_g$ is the bandgap energy of the material. This diagram illustrates an abrupt energy level change, and in this case the pn junction coincides with the metallurgical junction. Since the heterojunction bipolar transistor here illustrated uses a doping level for the base that is much higher than that for the emitter, the difference of energy in energy between the emitter and the base at the conduction band spike region 12 ($\Delta E_c$) is very close to the barrier height. (The potential dip, or notch 16 in the base is negligible.)

Since $\Delta E_c$ (the height of the spike) must be equal to or less than the scattering potential $\Delta E_{\Gamma-L}$, which equals 0.31 eV, the range of aluminum content in the semiconductor material can be determined from the following: $\Delta E_c = (1.06 \pm 0.03) X_{AlAs}$, for values of $X_{AlAs} \leq 0.45$, where $X_{AlAs}$ equals the aluminum content in the emitter. Thus, if $\Delta E_c$ is set at around 0.26 eV (which is less than the scattering energy level for the material, as defined above), then the aluminum level will be about 25%.

At the same time, an appropriate forward bias ($V_a$) must be established, producing the energy level values illustrated in FIG. 2, where $$V_a = V_D - \Delta E_c$$

$$V_a = E_{gB} - \delta_E - \delta_B$$

where $V_D$ is the potential built into the semiconductor at the emitter-base junction, and $\delta_E - \delta_B$ is the difference in energy between the conduction band (valance band) and the Fermi level.

The width of the spike region 12 depends on the doping level of the appropriate region of the emitter. In this case, the doping level may be about $2 \times 10^{16}$ cm$^{-3}$, and at this value, with $V_a \approx 1.3$ V, the depletion width in the region (emitter) is $W_\eta \approx 500$ Å, whereas for these values tunneling would be inconvenient even for a width of about 160 Å.

The width of the potential barrier can be adjusted, as illustrated in FIGS. 3(a) and 3(b), by displacing the electrical junction from the metallurgical junction GaAlAs—GaAs, by placing a thin interfacial material 18 between the emitter and base regions. The material 18 is a properly doped p⁻ type GaAlAs layer and its thickness is easily adjustable, thereby allowing easy adjustment of the width of the spike region.

The doping level of the p⁻ type material is chosen so that the layer 18 is fully depleted in normal operation; then the electron injection current depends mainly on the minority carrier concentration of the GaAs base region, and consequently the injection efficiency is still high. The doping level of the emitter can be higher in this case; for example $10^{17}$ cm$^{-3}$.

Figure 4B:
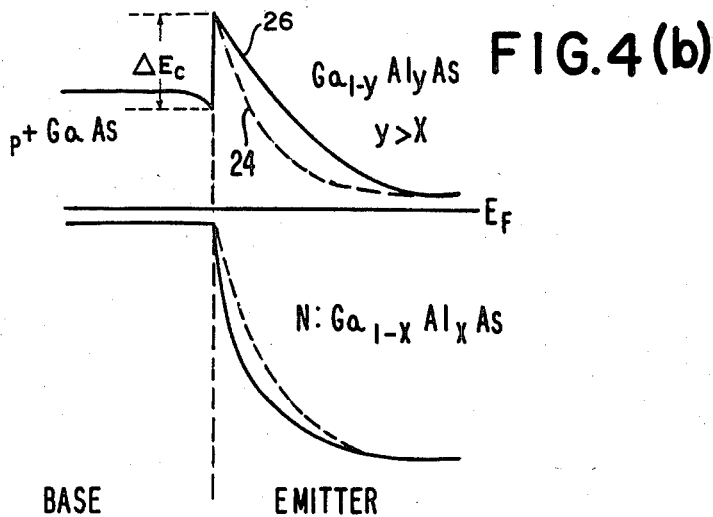
Figure 5:
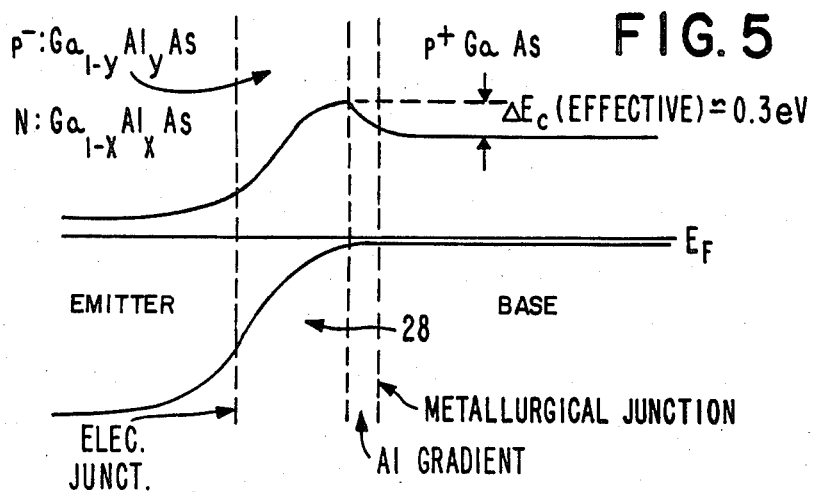
FIG. 5 is an energy band diagram of a sixth embodiment of the semiconductor heterojunction of the present invention.

The energy bands for typical quasi-abrupt interfaces, which provide more gradual heterojunction spikes, are illustrated diagramatically in FIGS. 4(a), 4(b) and 5. In these cases the gradient of aluminum is varied at the interfacial region in order to adjust the barrier height $E_c$ to the desired value. Thus, in FIG. 4(a) an N type GaAlAs—p+ type GaAs heterojunction similar to that illustrated in FIG. 1 is shown. Here, however, the expected spike 20, having a value $\Delta E_c$, is adjusted to $\Delta E_c$ (effective) by modifying the aluminum content in the interface region 22. Such a change in aluminum concentration causes a change in the field, and allows the shape and height of the spike to be varied. FIG. 4(a) shows a shorter spike, having generally linear slopes, but more complex shapes such as curves can be fabricated. The height of the effective barrier can be close to 0.3 eV even if $X_{Al} \geq 0.3$ v.

An energy band for another N type GaAlAs—p+ type GaAs heterojunction is shown in FIG. 4(b). In this case, the aluminum content of the emitter layer is increased in the depletion layer and reduced at the interface, changing the expected potential curve 24 to a new shape 26, and producing the desired value of the barrier voltage $E_c$.

The fabrication of the heterojunctions of FIGS. 4(a) and 4(b) to permit variations in the aluminum content of the emitter material can be easily controlled by using, for example, molecular beam epitaxial growth so as to achieve the appropriate height and width values for the spike region. However, in making such variations, attention must be paid to the importance of maintaining the maximum value of the spike below the energy needed to transfer electrons to the upper valley, of shaping the spike to minimize deflection, and of preventing tunneling.

In a device of the type illustrated in FIG. 3(a), the aluminum content of the N type GaAlAs region (emitter) can be higher than 30%, typically up to 45%. A slight, gradual interface can be drawn (see FIG. 5) between the emitter layer and a thin layer 28 of p⁻ type GaAlAs material between the emitter and the base, which layer serves to displace the electrical junction from the metallurgical junction, as previously described. This interface can produce an $X_{Al} \approx 30$ between the N and the P⁻ layers. At the next junction, between the p⁻ layer 28 and the P+ GaAs material of the base, the aluminum content can be decreased over a shorter distance in order to achieve a high field.

The fabrication of ballistic heterojunction transistors having the features described above can be accomplished as illustrated in FIGS. 6-8, to which reference is now made. FIG. 6 illustrates a quasi-planar transistor structure 30 of the type illustrated in French Pat. No. 7826069, dated 1978. Such a structure can be realized either by implantation or by diffusion for contacting the base on the same plane as the emitter through a p+ type region, in known manner, with the doping and the width of the interfaces being controlled to produce the features described above.

A mesa structure of the type illustrated in FIGS. 7(a)-7(d) can be used, and is particularly useful for gradual interfaces of the type described with respect to FIG. 4(b), where the $X_{AlAs} \approx > 40\%$. The fabrication steps for producing a mesa transistor such as transistor 32 are well known in the art.

Another structure using an emitter layer at the bottom is illustrated at 34 in FIG. 8(a). In this device, the emitter inductance can be reduced to low values suitable for high frequency operation. This structure can use a p+ type implanted wall for contacting the base on the same plane as the collector, as illustrated. A second implantation (isolation using protons, oxygen or boron for GaAs) may be used to reduce the lateral emitter capacitance.

The same transistor structure, with the emitter at the bottom, can also be realized by mesa, as shown at 36 in FIG. 8(b). The base region can be exposed by etching, and a self aligned structure can be used for contacting the base and collector very closely. An isolation implantation in the emitter layer and under the base contact can reduce the emitter base parasitic capacitance.

The semiconductor heterojunction device of the present invention is formed from group III-V compounds and may be produced by an epitaxial growth process. In particular, this includes GaAlAs—GaAs; In P—GaInAs; AlGaAsIn—GaInAs; and AlInAs—GaInAs couples of materials. Other materials can be considered at the temperature of liquid nitrogen, such as GaSb—AlSb or InSb—CdTe.

While the subject invention has been described with a certain degree of particularity, the foregoing as been made by way of illustration and not of limitation. Accordingly, all modifications, alterations and changes coming within the spirit and scope of the invention as set forth in the appended claims are herein meant to be included.

What is claimed is:

1. A method for producing a high-speed heterojunction bipolar semiconductor device, comprising:

forming a base region of a first semiconductor material having a first conductivity type;

forming emitter and collector regions on opposite sides of and adjacent said base region, said emitter and collector regions being of a semiconductor material having a second conductivity type to produce an emitter-base junction and a collector-base junction, respectively, said emitter region being doped to a first doping level;

the step of forming said base region including doping said base semiconductor material to a doping level higher than the doping level of said emitter material to produce an emitter-base conduction band step having a high potential barrier and a sharp potential drop on the base side of said emitter-base junction, the height of said barrier being sufficient to produce a high kinetic energy level in electrons thermally injected by a forward bias applied across said emitter-base junction over said barrier from said emitter region into said base region, said barrier height being selected to produce in said injected electrons a kinetic energy level close to but slightly lower than the energy level required for injection of said electrons into an upper valley energy level in said base, said base region being formed to have a thickness substantially equal to the mean distance of travel of injected electrons so that said high kinetic energy level provides substantially ballistic transport of said electrons through said base region substantially without collision; and forming an interface region in said emitter material at said emitter-base junction to produce in said potential barrier a predetermined width gradient sufficient to prevent electron tunnelling through said barrier.

2. The method of claim 1, wherein the step of producing in said potential barrier a predetermined width gradient includes selectively doping a portion of said emitter material to produce a doping level sufficient to produce a depletion region at said emitter-base junction.

3. The method of claim 1, wherein the step of producing said predetermined width gradient includes forming in said interface region of said emitter material a region of said first conductivity type to shape said potential barrier to achieve a selected barrier height, width and slope.

4. The method of claim 1, wherein the step of producing said predetermined width gradient includes forming in said interface region a thin layer of semiconductor material having the same conductivity type as the semiconductor material of said base region, but differently doped, to thereby displace the electrical emitter-base junction from the metallurgical emitter-base junction.

5. The method of claim 1, further including displacing the electrical emitter-base junction from the metallurgical emitter-base junction in said interface region.

* * * * *